United States Patent
Chen

(10) Patent No.: US 7,656,986 B2
(45) Date of Patent: Feb. 2, 2010

(54) LOW JITTER PHASE ROTATOR

(75) Inventor: Chun Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/153,782

(22) Filed: May 23, 2008

(65) Prior Publication Data
US 2008/0224910 A1 Sep. 18, 2008

Related U.S. Application Data

(63) Continuation of application No. 10/131,033, filed on Apr. 25, 2002, now Pat. No. 7,379,520.
(60) Provisional application No. 60/368,557, filed on Apr. 1, 2002.

(51) Int. Cl.
*H03D 3/24* (2006.01)
*H04L 23/00* (2006.01)

(52) U.S. Cl. ............... 375/375; 375/354; 375/371; 375/372; 375/373; 375/374; 375/376

(58) Field of Classification Search .......... 375/354, 375/371, 372, 373, 374, 375, 376
See application file for complete search history.

(56) References Cited

U.S. PATENT DOCUMENTS

| 4,424,486 A | 1/1984 | Denton et al. |
| 4,816,775 A | 3/1989 | Ryan |
| 5,311,546 A | 5/1994 | Paik et al. |

(Continued)

FOREIGN PATENT DOCUMENTS

EP 0909035 A2 4/1999

(Continued)

OTHER PUBLICATIONS

Malvino et al; "Digital Principals and Applications", McGraw-Hill Co. 1986; p. 302.

(Continued)

*Primary Examiner*—Jason M. Perilla
(74) *Attorney, Agent, or Firm*—Sterne, Kessler, Goldstein & Fox P.L.L.C.

(57) ABSTRACT

A phase rotator generates an output signal having plurality of possible output phases with reduced phase jitter. The low jitter phase rotator includes a plurality of differential amplifiers configured to receive a plurality of input differential signals having different phases, and configured to generate a plurality of weighted signals responsive to the plurality of input differential signals. A plurality of digital-to-analog converters (DAC) are arranged into a plurality of groups, each group of DACs configured to provide current for one of the corresponding differential amplifiers. The number of active DACs in each group of DACs determines a relative weighting of the weighted signals, where relative weighting determining an output phase of an output signal of the phase rotator. The DACs are configured to adjust the output phase of the phase rotator. At a $k^{th}$ phase, N/4 adjacent DACs are activated that are indexed as $m_0, m_1, \ldots m_{(N/4)-1}$, wherein N is the number of said plurality of DACs. At $(k+1)^{th}$ phase, a $m_{(N/4)}$ DAC is activated that is adjacent to the $m_{(N/4-1)}$ DAC. At $(k+2)^{th}$ phase, the $m_0$ DAC is de-activated.

12 Claims, 14 Drawing Sheets

U.S. PATENT DOCUMENTS

| | | | | |
|---|---|---|---|---|
| 5,359,636 | A * | 10/1994 | Aoyama | 377/73 |
| 5,475,344 | A | 12/1995 | Meaneatis et al. | |
| 5,485,490 | A | 1/1996 | Leung et al. | |
| 5,764,718 | A * | 6/1998 | Sutardja et al. | 377/73 |
| 6,002,279 | A | 12/1999 | Evans et al. | |
| 6,122,336 | A | 9/2000 | Anderson | |
| 6,363,124 | B1 | 3/2002 | Cochran | |
| 6,459,751 | B1 | 10/2002 | Chen et al. | |
| 6,473,470 | B1 | 10/2002 | Matui | |
| 6,490,332 | B1 | 12/2002 | Somayajula | |
| 6,501,336 | B2 | 12/2002 | Kim et al. | |
| 6,509,773 | B2 | 1/2003 | Buchwald et al. | |
| 6,570,946 | B1 | 5/2003 | Homol et al. | |
| 7,064,620 | B1 | 6/2006 | Lai et al. | |
| 7,379,520 | B2 | 5/2008 | Chen | |
| 2002/0010818 | A1 * | 1/2002 | Wei et al. | 710/62 |
| 2002/0044618 | A1 * | 4/2002 | Buchwald et al. | 375/355 |
| 2002/0094057 | A1 | 7/2002 | Shibuya | |
| 2003/0002596 | A1 | 1/2003 | Dunning et al. | |
| 2003/0076918 | A1 * | 4/2003 | Azuma et al. | 377/73 |
| 2004/0239432 | A1 * | 12/2004 | Fallahi et al. | 331/74 |

FOREIGN PATENT DOCUMENTS

| | | |
|---|---|---|
| WO | WO 01/84702 A2 | 11/2001 |
| WO | WO 01/84702 A3 | 11/2001 |

OTHER PUBLICATIONS

European Search report for Appln. No. EP 03 00 7416, issued Jul. 7, 2003, 2 pages.

European Search report for Appln. No. EP 03 00 7417, issued Jul. 7, 2003, 3 pages.

* cited by examiner

| Level | 0° | | | | 90° | | | | 180° | | | | 270° | | | |
|---|---|---|---|---|---|---|---|---|---|---|---|---|---|---|---|---|
| | DAC 1 | DAC 2 | DAC 3 | DAC 4 | DAC 5 | DAC 6 | DAC 7 | DAC 8 | DAC 9 | DAC 10 | DAC 11 | DAC 12 | DAC 13 | DAC 14 | DAC 15 | DAC 16 |
| 0 | 1 | 1 | 1 | 1 | 0 | 0 | 0 | 0 | 0 | 0 | 0 | 0 | 0 | 0 | 0 | 0 |
| 1 | 0 | 1 | 1 | 1 | 1 | 0 | 0 | 0 | 0 | 0 | 0 | 0 | 0 | 0 | 0 | 0 |
| 2 | 0 | 0 | 1 | 1 | 1 | 1 | 0 | 0 | 0 | 0 | 0 | 0 | 0 | 0 | 0 | 0 |
| 3 | 0 | 0 | 0 | 1 | 1 | 1 | 1 | 0 | 0 | 0 | 0 | 0 | 0 | 0 | 0 | 0 |
| 4 | 0 | 0 | 0 | 0 | 1 | 1 | 1 | 1 | 0 | 0 | 0 | 0 | 0 | 0 | 0 | 0 |
| 5 | 0 | 0 | 0 | 0 | 0 | 1 | 1 | 1 | 1 | 0 | 0 | 0 | 0 | 0 | 0 | 0 |
| 6 | 0 | 0 | 0 | 0 | 0 | 0 | 1 | 1 | 1 | 1 | 0 | 0 | 0 | 0 | 0 | 0 |
| 7 | 0 | 0 | 0 | 0 | 0 | 0 | 0 | 1 | 1 | 1 | 1 | 0 | 0 | 0 | 0 | 0 |
| 8 | 0 | 0 | 0 | 0 | 0 | 0 | 0 | 0 | 1 | 1 | 1 | 1 | 0 | 0 | 0 | 0 |
| 9 | 0 | 0 | 0 | 0 | 0 | 0 | 0 | 0 | 0 | 1 | 1 | 1 | 1 | 0 | 0 | 0 |
| 10 | 0 | 0 | 0 | 0 | 0 | 0 | 0 | 0 | 0 | 0 | 1 | 1 | 1 | 1 | 0 | 0 |
| 11 | 0 | 0 | 0 | 0 | 0 | 0 | 0 | 0 | 0 | 0 | 0 | 1 | 1 | 1 | 1 | 0 |
| 12 | 0 | 0 | 0 | 0 | 0 | 0 | 0 | 0 | 0 | 0 | 0 | 0 | 1 | 1 | 1 | 1 |
| 13 | 1 | 0 | 0 | 0 | 0 | 0 | 0 | 0 | 0 | 0 | 0 | 0 | 0 | 1 | 1 | 1 |
| 14 | 1 | 1 | 0 | 0 | 0 | 0 | 0 | 0 | 0 | 0 | 0 | 0 | 0 | 0 | 1 | 1 |
| 15 | 1 | 1 | 1 | 0 | 0 | 0 | 0 | 0 | 0 | 0 | 0 | 0 | 0 | 0 | 0 | 1 |

FIG.11

| Level | 0° | | | | 90° | | | | 180° | | | | 270° | | | |
|---|---|---|---|---|---|---|---|---|---|---|---|---|---|---|---|---|
| | DAC 1 | DAC 2 | DAC 3 | DAC 4 | DAC 5 | DAC 6 | DAC 7 | DAC 8 | DAC 9 | DAC 10 | DAC 11 | DAC 12 | DAC 13 | DAC 14 | DAC 15 | DAC 16 |
| k | 0 | 0 | 0 | 0 | 0 | 0 | 1 | 1 | 1 | 1 | 0 | 0 | 0 | 0 | 0 | 0 |
| k+1 | 0 | 0 | 0 | 0 | 0 | 0 | 1 | 1 | 1 | 1 | 1 | 0 | 0 | 0 | 0 | 0 |
| k+2 | 0 | 0 | 0 | 0 | 0 | 0 | 0 | 1 | 1 | 1 | 1 | 0 | 0 | 0 | 0 | 0 |

FIG.12

LOW JITTER PHASE ROTATOR

CROSS REFERENCE TO RELATED APPLICATIONS

This application is a continuation of U.S. application Ser. No. 10/131,033, titled "Low Jitter Phase Rotator", filed Apr. 25, 2002, now U.S. Pat. No. 7,379,520, which claims priority to U.S. Provisional Application No. 60/368,557, filed Apr. 1, 2002, titled "Multiple Synthesized Clocks with Fractional PPM Control from a Single Clock Source", both of which are incorporated herein by reference in their entireties.

This application is also related to U.S. application Ser. No. 10/131,034, filed Apr. 25, 2002, titled "Multiple Synthesized Clocks with Fractional PPM Control from a Single Clock Source", now U.S. Pat. No. 6,922,109, which is incorporated by reference in its entirety.

BACKGROUND OF THE INVENTION

1. Field of the Invention

The present invention relates to an apparatus for generating multiple clocks from a single reference clock source.

2. Background Art

Electronic systems using MPEG (Moving Pictures Experts Group) compression method for video or audio data is well known. There are several different varieties of MPEG formats currently available. When data is compressed using MPEG, some of the data is lost during the compression. Such loss of data may be attributed to different factors such as variation of components in the system, signal jitter and others.

MPEG formats are most often used to record video or audio data of the World Wide Web and other sources to be used for later playback. A user is often inconvenienced by having to wait until recording of the MPEG-coded data finishes in order to do something else with the data. The time when such recording taking place might also be an inconvenience to the user. There is a need to provide a better multi-functional system that will enable a user to perform multiple functions, such as watching a movie on a cable channel, while an MPEG-coded material is being downloaded from the Internet, or downloading an MPEG-coded material at a preselected time other than the time it is playing.

Conventionally known systems do not allow a user to perform such multitude of functions without increasing circuit area and power requirements. In fact, most conventional systems have a large circuit area, require greater operational power and produce a lot of jitter. Therefore, there is a need for a better system that is capable of performing the above functions without increasing circuit area and operational power.

BRIEF SUMMARY OF THE INVENTION

The present invention is a phase rotator that generates an output signal having plurality of possible output phases with reduced jitter between the output phase states.

The low jitter phase rotator includes a plurality of differential amplifiers configured to receive a plurality of input differential signals having different phases, and configured to generate a plurality of weighted signals responsive to said plurality of input differential signals. A plurality of digital-to-analog converters (DAC) are arranged into a plurality of groups, each group of DACs configured to provide current for one of said corresponding differential amplifiers. The number of active DACs in each group of DACs determines a relative weighting of the weighted signals, where relative weighting determining an output phase of an output signal of the phase rotator. The DACs are configured to adjust the output phase of the phase rotator. At a $k^{th}$ phase, N/4 adjacent DACs are activated that are indexed as $m_0, m_1, \ldots m_{(N/4)-1}$, wherein N is the number of said plurality of DACs. At $(k+1)^{th}$ phase, a $m_{(N/4)}$ DAC is activated that is adjacent to the $m_{(N/4)-1}$ DAC. At $(k+2)^{th}$ phase, the $m_0$ DAC is de-activated.

The $m_0^{th}$ DAC is left active at the $(k+1)^{th}$ phase, and is not deactivated until the $(k+2)^{th}$. The result is that there is one more active DACs at the $(k+1)^{th}$ phase than at the $k^{th}$ phase or the $(k+2)^{th}$ phase. Therefore, the gaps between the $k^{th}$, $(k+1)^{th}$, and $(k+2)^{th}$ phase states are reduced, thereby reducing the phase jitter of the phase rotator.

A shift register having N outputs controls the switches in the N-number of DACs. The shift register is configured to shift N/4 bits through the N outputs, so as to control the corresponding switches of the N number of DACs. The N/4 bits in the shift register determine the relative weighting of the weighted signals, and thereby determine the output phase of the output signal. The N/4 bits in the shift register are continuously shifted through the shift register, thereby causing the output phase to rotate around an 360 degree cycle. The continuous phase rotation causes the output signal to be frequency shifted based on the rate that the N/4 bits are shifted through said shift register.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

FIG. 8b is a more detailed illustration of an embodiment of the 4-bit phase rotator shown in FIG. 8a.

FIG. 9 is a block diagram of an embodiment of a digital-to-analog converter shown in FIG. 8a.

FIG. 11 is a table showing sequences representing phases generated by a 4-bit phase rotator.

FIG. 12 is a table showing sequences representing phases generated by a modified 4-bit phase rotator, according to embodiments of the present invention.

DETAILED DESCRIPTION OF THE INVENTION

Table of Contents

1. Overview
2. Phase Locked Loop Circuit
3. Multiple Synthesized Clocks with Fractional PPM Control from a Single Clock Source
4. Phase Rotator
5. Low Jitter Phase Rotator
6. Conclusions

1. OVERVIEW

The present invention relates to systems and methods for generating multiple clock sources from a single reference clock source. The multiple clock sources can be coupled to output circuits that require different frequency clocks.

In an embodiment, the present invention includes plurality of phase rotators coupled to the output of a PLL. The PLL receives a reference signal and generates a plurality of output signals having a respective plurality of phases. The output signals from the PLL are supplied to the plurality of phase rotators. Each phase rotator is configured to (1) assign a relative weighting to the signals from the PLL to form a plurality of weighted signals, and (2) combine the weighted signals to form an output signal, wherein the relative weighting determines an output phase of the output signal. The output phase is rotated at a continuous rate to implement fine frequency tuning, since frequency is the derivative of phase.

The present invention may be implemented in a system, where a plurality of audio or video equipment is coupled to the PLL. Such equipment may have specific requirements with respect to its driving clock sources.

Figure 1:
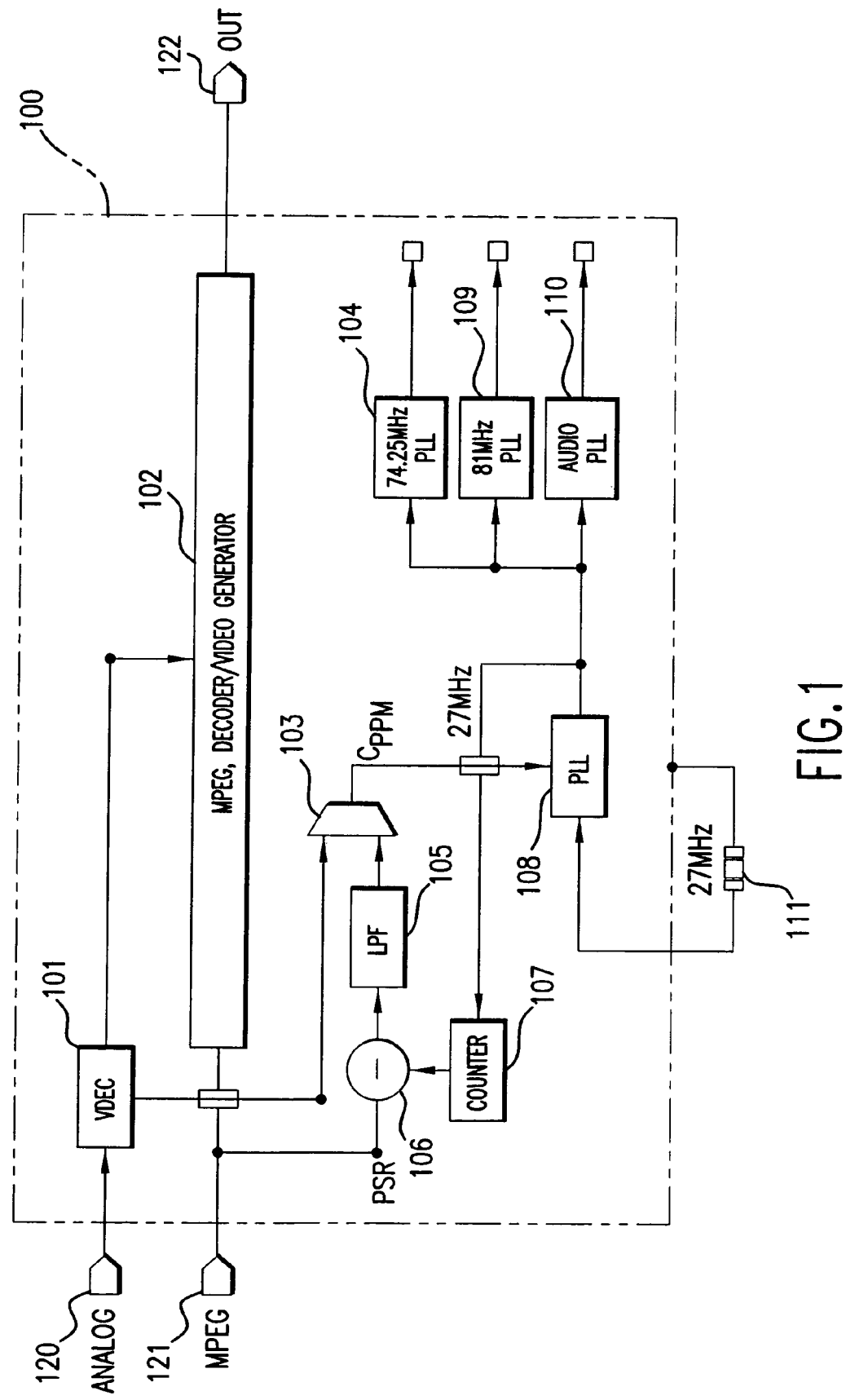
FIG. 1 is a block diagram illustrating an example environment for the present invention may be implemented.

FIG. 1 illustrates an example environment for the present invention. The system 100 is shown to have an analog input pad 120 and an MPEG input pad 121. Input signals having input frequency are supplied through these two pads. The input signal received by the analog input pad 120 is processed by the video decoder 101. The input signal received by the MPEG input pad 121 is processed by the MPEG Decoder/Video Generator 102. The signal generated by the video decoder 101 is also processed by the device 102. The output pad 122 receives an output signal and is coupled to the device 102. The output signal may be in the form of a video, audio, or other signals.

The input signals received at the input pads 120 and 121 are processed and supplied to the system as a control signal ($C_{PPM}$) signal from the multiplexor 103, where PPM represents parts per million. The $C_{PPM}$ signal represents a desired frequency shift in the output of the PLL 108 in parts per million. The output of the PLL 108 is then processed by various circuits 104, 109, and 110. For each circuit 104, 109 and 110, the desired frequency may differ. Therefore, there is an need for a way to generate multiple output signals having different frequencies from a common PLL.

2. PHASE LOCKED LOOP CIRCUIT

In an embodiment, the present invention includes a phase locked loop (PLL) circuit. The following is a description of a PLL that may be used by the present invention. It is understood by one skilled in the art that other types of PLL circuits may be implemented by the present invention.

Figure 6:
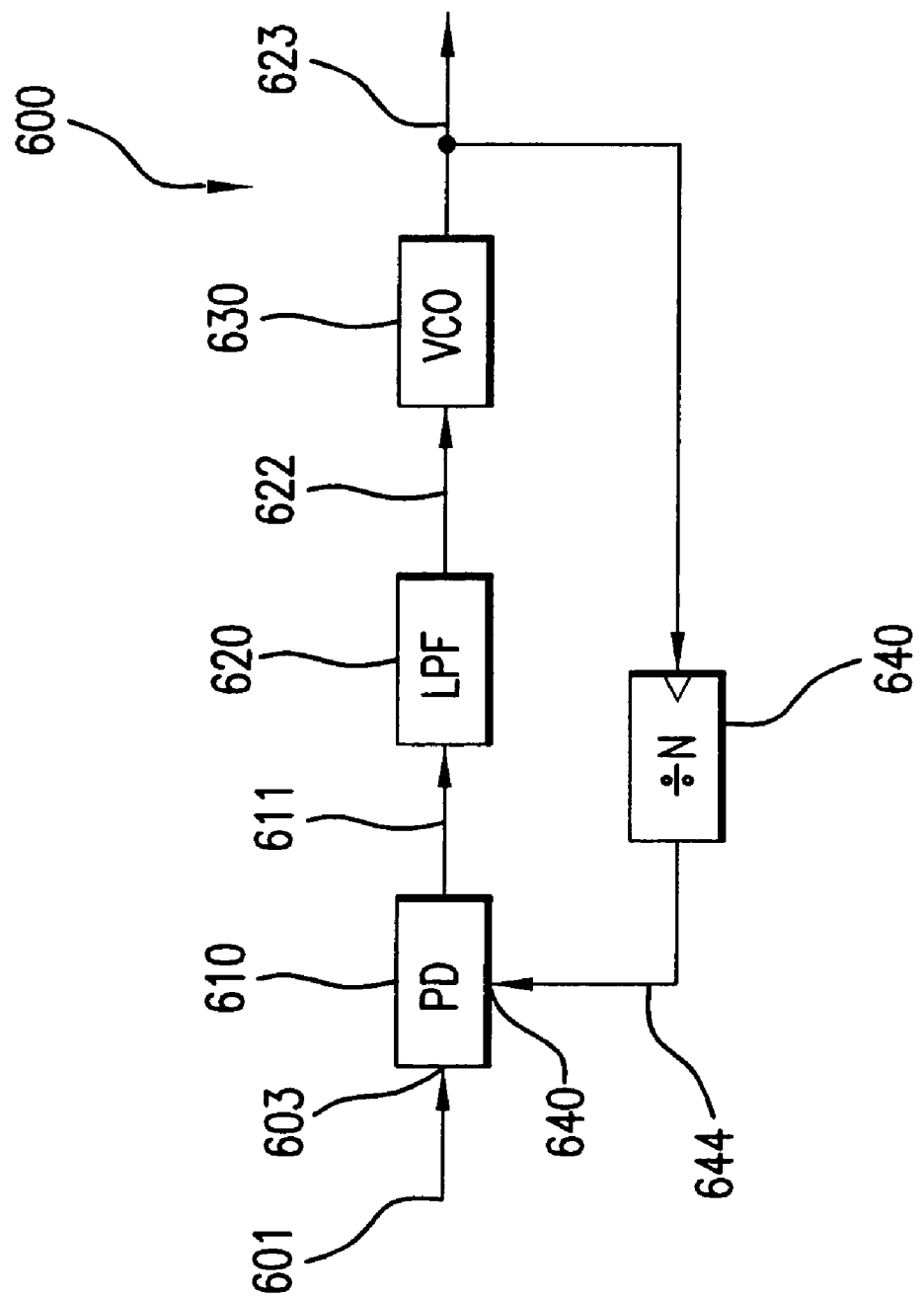
FIG. 6 illustrates phase locked loop circuit.

FIG. 6 illustrates a PLL 600 that is used to generate an output clock that is frequency locked to a reference frequency that is received by the PLL 600. The PLL 600 contains a phase detector 610, low pass filter 620, a voltage controlled oscillator (VCO) 630, and a divider 640.

The phase detector 610 is a device that compares the phases of two input signals, generating a phase-error output that is a measure of their difference. More specifically, the phase detector 610 receives an input reference signal 601 at a first input terminal 603 and a VCO feedback signal 644 at a second input terminal 604. The phase detector 610 compares the phases of the input reference signal 601 with the VCO feedback signal 644. The phase detector 610 includes a charge pump that generates an output current 611 representative of the phase difference between input reference signal 601 and VCO feedback signal 644.

The filter 620 low-pass filters the phase detector output 611 to remove high frequency noise, and producing an output voltage 622. The output voltage 622 of the low pass filter 620 is the control voltage for the VCO 630.

The VCO 630 receives the control voltage 622 and generates an output signal 633 having a frequency that is determined by the control voltage 622.

The divider circuit 640 divides the frequencies of the VCO output signal 633 so that it is consistent with the frequency of the input signal 601, generating the VCO feedback signal 644.

3. MULTIPLE SYNTHESIZED CLOCKS WITH FRACTIONAL PPM CONTROL FROM A SINGLE CLOCK SOURCE

The present invention relates to systems and methods for generating multiple clock sources from a single reference clock source. The multiple clock sources can be coupled to output circuits that require different frequency clocks.

In an embodiment, the present invention includes plurality of phase rotators coupled to the output of a phase lock loop PLL. The PLL receives a reference signal and generates a plurality of output signals having a respective plurality of phases. The output signals from the PLL are supplied to the plurality of phase rotators. Each phase rotator is configured to assign a relative weighting to the signals from the PLL to form a plurality of weighted signals, and combine the weighted signals to form an output signal, wherein the relative weighting determines an output phase of the output signal. The output phase is rotated at a continuous rate to implement fine frequency tuning, since frequency is the derivative of phase.

Figure 2:
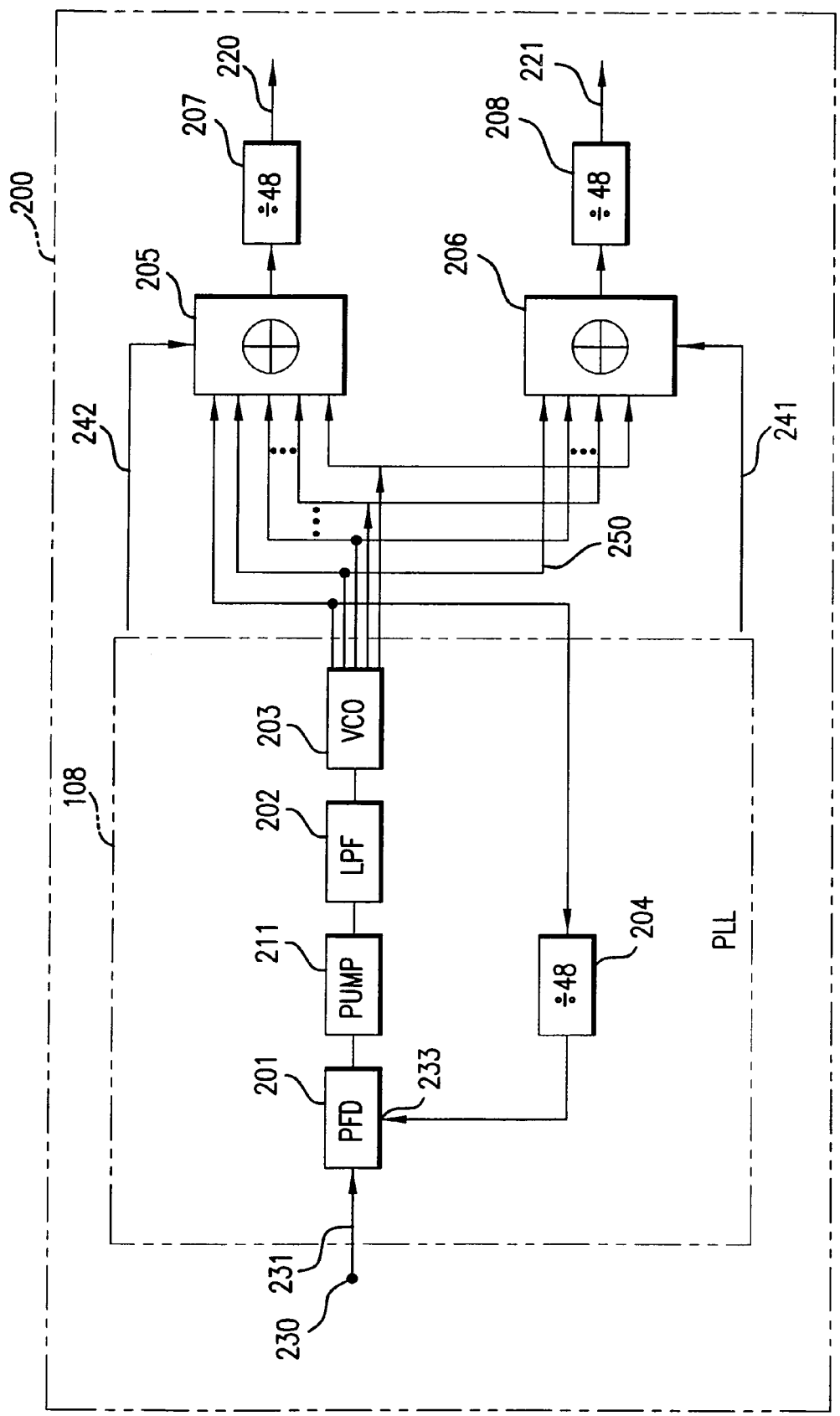
FIG. 2 is a block diagram of an embodiment of the present invention having a PLL coupled to two phase rotators.

FIG. 2 illustrates a system 200 for generating multiple clocks from a single reference clock according to an embodiment of the present invention. System 200 includes a phase locked loop circuit 108 coupled to two phase rotator circuits 205 and 206. The phase rotators 205 and 206 are located outside the phase lock loop 108. It is understood by one skilled in the art that any number of phase rotator circuits may be coupled to the phase locked loop circuit 108 so as to generate any number of output signals.

The phase locked loop circuit 108 has an input terminal 230 that receives a reference signal 231 to the phase locked loop circuit 108. The reference signal 231 has a reference signal frequency and a reference phase.

The phase locked loop circuit 108 further has a phase detector 201, a charge pump 211, a low pass filter 202, a voltage controlled oscillator 203, along with a divider circuit 204. The phase detector 201 receives the reference signal 231 through its first input terminal 230 and receives a signal fed back from the VCO 203 at its second input terminal 233. The signal received at the second input terminal 233 is fed back by the divider circuit 204. The phase detector 201 compares frequencies of signals received at both input terminals 232 and 233, and generates an error signal that represents the phase difference.

The charge pump 211 receives the error signal from the phase detector 201 and generates an error current that drives the low pass filter 202.

The low pass filter 202 is coupled between the output of the charge pump 211 and the voltage controlled oscillator 203. The low pass filter 202 filters the output current from the charge pump 211 to remove high frequency noise, producing a low frequency or DC control voltage for the VCO 203. The passband of the filter 202 may vary according to requirements of the system 200.

The VCO 203 receives the control voltage signal from the low pass filter 202, and generates an output signal having a frequency that is tuned according to the control voltage from the lowpass filter 202. The divider circuit 204 is coupled between the VCO 203 output and the phase detector input terminal 233. The divider circuit 204 divides the frequency of the VCO output signal so that it is consistent with the frequency of the input signal 231, allowing the phase detector 201 to compare the input signal 230 to the feedback signal 233. The divider circuit 204 has a divider ratio that can be set according to the requirements of the system 200.

In one embodiment, the VCO 203 includes a plurality of delay cells or buffers that are configured to oscillate. For example, the buffers can be series-connected, where the output of the buffers is fed back in-phase to the input of the buffers, causing the buffers to oscillate. Multiple output taps can be taken between the buffers to generate a plurality of output signals having respective different output phases, as represented by output signals 250 in FIG. 2. Each output signal 250 has a different output phase, and differs from the output phase of an adjacent signal by the amount of buffer delay.

Because the VCO 203 is coupled to the divider circuit 204, the PLL is capable of generating a multiple of the reference signal frequency 230.

The phase rotators 205 and 206 each receive the plurality of output signals 250 having corresponding different phases. The phase rotators 205 and 206 are configured to (1) assign a relative weighting to the signals from the PLL 108 to form a plurality of weighted signals, and (2) combine the weighted signals to form a respective output signal, wherein the relative weighting determines an output phase of the output signal. More specifically, the phase rotators 205 and 206 continuously rotate their respective output signals through 360 degrees with greater resolution than that associated with the output signals 250. By continuously rotating the output signals 250, the phase rotators 205 and 206 introduce a frequency shift in the respective output signals 220 and 221, where the amount of frequency shift is determined by the rotation speed of the respective phase rotator.

Figure 10:
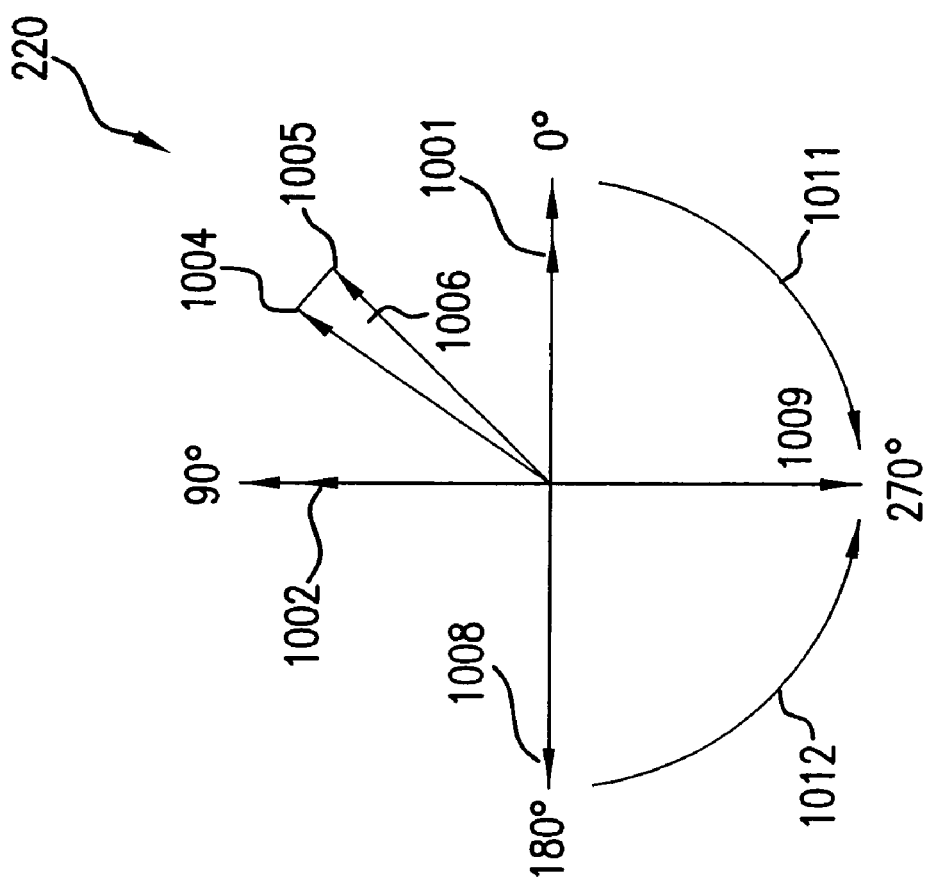
FIG. 10 is a diagram of a full phase cycle showing particular phases.

FIG. 10 illustrates a full phase rotation cycle of the output signal 220 (and is also representative of the output signal 221). The phase rotator 205 continuously rotates the phase of output signal 220 around the full 360 degree cycle. The continuous phase rotation implements a frequency shift because frequency is the derivative of phase. As shown in FIG. 10, the phase rotation occurs in steps or increments around the 360 cycle, where a phase state 1005 is shown to be adjacent to a phase state 1004. A gap 1006 is formed between the two adjacent phases 1004 and 1005. This gap 1006 represents phase jitter and should be minimized by reducing the size of the phase steps.

In one embodiments discussed further herein, the phase rotators 205 and 206 are able to reduce the amount of the jitter in the signal by increasing the phase resolution so that the number of phase states around the 360 degree cycle are increased. In other words, each adjacent phase state is generated closer to the next adjacent phase state, thereby reducing the phase jitter without increasing circuit size or operational power. In other words, the smaller the gap 1006 (in FIG. 10), the smaller the jitter in the system. Conversely, the larger the gap 1006, the larger the jitter in the system.

A control signal 242, externally supplied to the phase rotator 205, determines the rotation speed of the phase rotator 205, and therefore the frequency shift introduced by the phase rotator 205. A divider circuit 207 receives the output of the phase rotator 205 and divides the frequency of the output signal of the phase rotator by the divider ratio (e.g. 48) to generate the output signal 220.

A control signal 241, externally supplied to the phase rotator 206, determines the rotation speed of the phase rotator 206, and therefore the frequency shift introduced by the phase rotator 206. A divider circuit 208 receives the output of the phase rotator 206 and divides the frequency of the output signal of the phase rotator by the divider ratio (e.g. 48) to generate the output signal 221.

Figure 3:
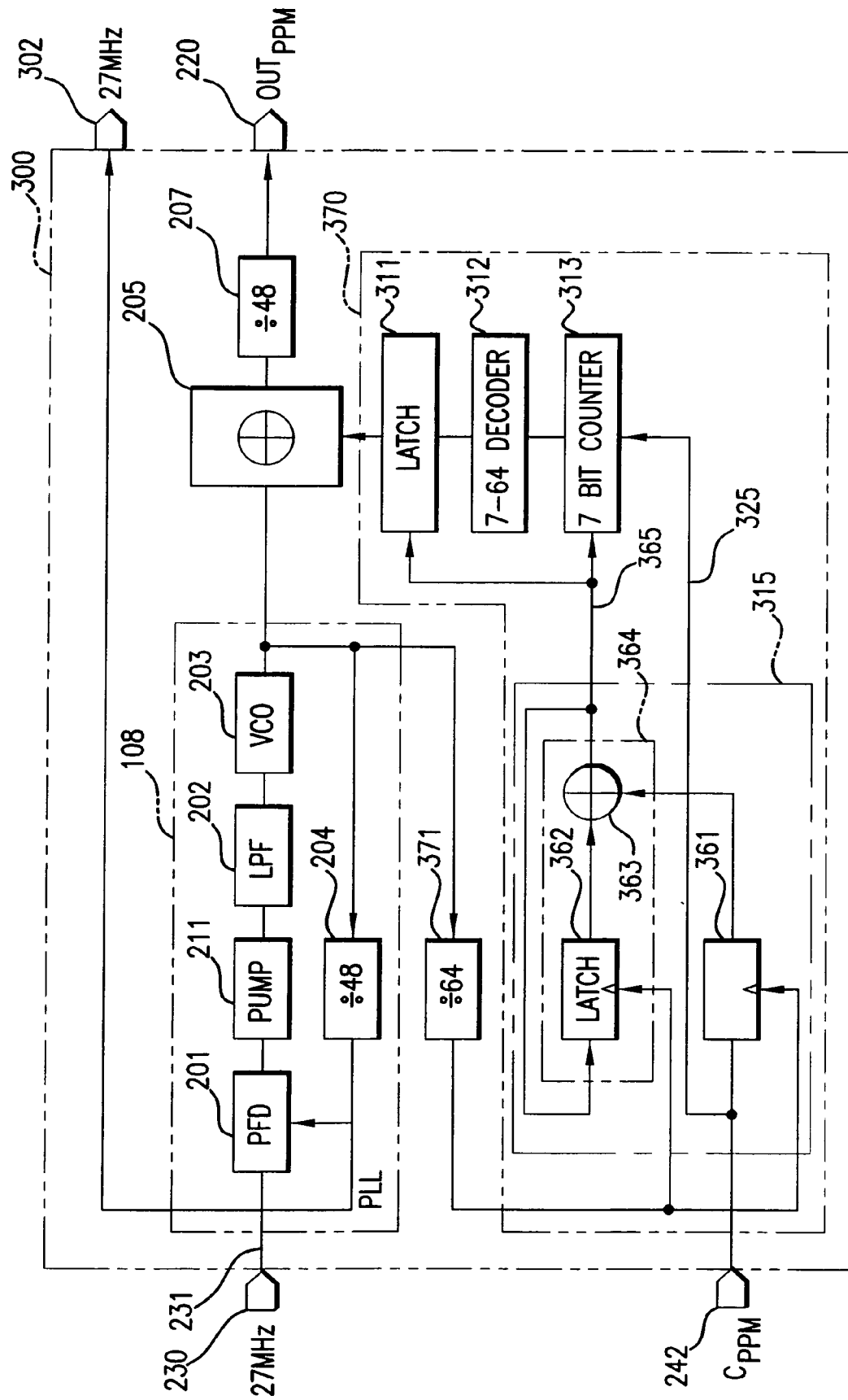
FIG. 3 is a more detailed block diagram of an embodiment of the present invention illustrating a logic control circuit.

FIG. 3 illustrates a logic control circuit 370 for the phase rotator 205. A similar logic control circuit controls the phase rotator 206, but is not shown for ease of illustration. The logic circuitry 370 includes a logic control unit 315 that receives the control signal 242, which indicates a desired frequency shift to be performed by the phase rotator 205. In one embodiment, the control signal 242 is a parts per million (PPM) count signal ($C_{PPM}$), where $C_{PPM}$ represents the amount of desired frequency shift measured in quantities of parts per million. One PPM would represent a frequency shift of 1 Hz for every 1 MHz of output frequency.

The $C_{PPM}$ signal 242 is applied to the logic control unit 315. The logic control unit 315 is coupled with a divider circuit 371. The divider circuit 371 provides a reference clock phase to an accumulator circuit 364 within the logic control unit 315. The frequency output of the accumulator circuit 364 is determined by the following formula:

$$f_{364} = \frac{f_{371} * C_{PPM}}{2^{11}}$$

where, $f_{364}$ is an output frequency of the accumulator circuit 364, $f_{371}$ is an output frequency of the divider circuit 371, and $2^{11}$ factor indicates that the accumulator circuit 364 is an 11-bit accumulator circuit. It is understood by one skilled in the art that the accumulator circuit 364 may an n-bit accumulator circuit.

The logic control unit 315 is further coupled to a 7-bit counter 313, 7-64 decoder 312, and a latch 311.

The phase rotator 205 generates an even greater number of phases from the plurality of phases already generated by the phase locked loop circuit 108. More specifically, the phase rotator 205 continuously rotates the output signals through 360 degrees with greater resolution than that associated with the output signals 250. By continuously rotating the output signals 250, the phase rotator 205 introduces a frequency shift in the output signals 220, where the amount of frequency shift is determined by the rotation speed of the respective phase rotator. The rotation speed of the phase rotator is controlled by the control signal supplied to it by the logic circuitry 370.

The frequency of the output signals 250 are determined using the input signal frequency 231 and an error factor. The error factor is derived from the value of the control signal ($C_{PPM}$), according to the following equations:

$$f_{OUT} = f_{IN} + \frac{C_{PPM}}{2^{18}} * \frac{f_{VCO}}{N} \qquad (1)$$

where $$f_{VCO} = DividerRatio * f_{IN} \qquad (2)$$

where:

$f_{IN}$ is the frequency of the input signal 231 received at the input terminal 230; $f_{OUT}$ is the frequency of the output signal 220; and $f_{VCO}$ is the oscillating frequency of the voltage controlled oscillator 203; N is a divider ratio set by the divider circuit 371 within the logic control unit 315 (e.g., N=64 in this embodiment). Furthermore, the factor $2^{18}$ indicates that the system comprises the 7-bit counter 313 and the 11-bit accumulator circuit 364.

The 7-bit counter 313 receives data-in bits from the logic control unit 315. In one embodiment, the counter 313 is capable of storing a 7-bit digital word. The 7-bit counter 313 may be substituted with any other counter depending on how many phases are generated by the phase rotator 205. Once the counter has a 7-bit digital word formed from bits sent to it, the counter 313 forwards the digital word to the decoder 312. The decoder 312 converts 7-bit digital word into a 64-character sequence of 0's and 1's. The latch 311, which is also coupled to the logic control unit 315 is preset so that when the counter 313 has a 7-bit digital word and it is properly decoded by the decoder 312, the latch will toggle the phase rotator 205 to increase or decrease the speed of the phase rotation, to adjusting the frequency shift provided by the phase rotator 205.

The counter 313 receives information in bits from the logic control unit 315. Such information may be modified by the unit 315 by adding or subtracting bits via a sign bus 325. By adding bits to the counter, the phase rotator is rotating clockwise. By subtracting the bits from the counter, the phase rotator is rotating counterclockwise. Referring back to FIG. 10, the clockwise rotation is shown by a directional arrow 1011 and the counterclockwise rotation is shown by a directional arrow 1012.

Referring back to FIG. 3, once the counter 313 has a value (i.e., a 7-bit digital word), it would mean that the a phase rotator needs adjust its rotation speed. After which, the counter value is reset so that the operation cycle is changed until the counter 313 reaches the desired value.

The logic control unit 315 also includes the accumulator 364 coupled to a timing synchronization latch 361. The accumulator 364 further comprises a latch 362 coupled to a most significant bit (MSB) device 363. The accumulator 364 sends a MSB signal 365 to the 7-bit counter 313. The most significant bit device 363 determines that portion of a number, address or field which occurs leftmost when its value is written as a single number in conventional hexadecimal or binary notation.

If the MSB device 363 determines that the first bit sent to the counter is 0, then the bits are subtracted and the phase rotator rotates counterclockwise. If the MSB device 363 determines that the first bit is 1, then the bits are added and the phase rotator rotates clockwise.

By supplying signal 242 to the logic control unit 315, the signal is processed by the synchronization latch 361 and latch 362. Depending on the value of the $C_{PPM}$, the number of bits received by the 7-bit counter 313 via connection 325 is either increased or decreased. However, once the counter 313 has 7-bits of data (according to this particular embodiment), the number of bits does not change.

Once the 7-bit counter 313 has a count, i.e., it has received 7-bits of data and the decoder 312 has decoded it, the latch 311 sends a signal to the phase rotator 310 to set or adjust the rotation speed of the phase rotator 205.

In an embodiment of the present invention, the input reference signal 231 is at 27 MHz. In this embodiment of the present invention, the divider ratio is 48. Therefore, the voltage controlled oscillator 203 oscillates at approximate an frequency of 1.3 GHz. If the VCO 203 is oscillating at 1.3 GHz, then the frequency of the output signal 220 is determined using formulas (1) and (2) above. In a particular embodiment:

$$f_{OUT} = 27 \text{ MHz} \pm \frac{C_{PPM}}{2^{18}} * \frac{(48 * 27 \text{ MHz})}{64} \qquad (3)$$

where $C_{PPM}$ is a programmable 12-bit digital signal. It is understood by one skilled in the art that $C_{PPM}$ may assume any other value according to the requirements of the system, as well as the divider circuit ratio 64 can be any other ratio.

Figure 5:
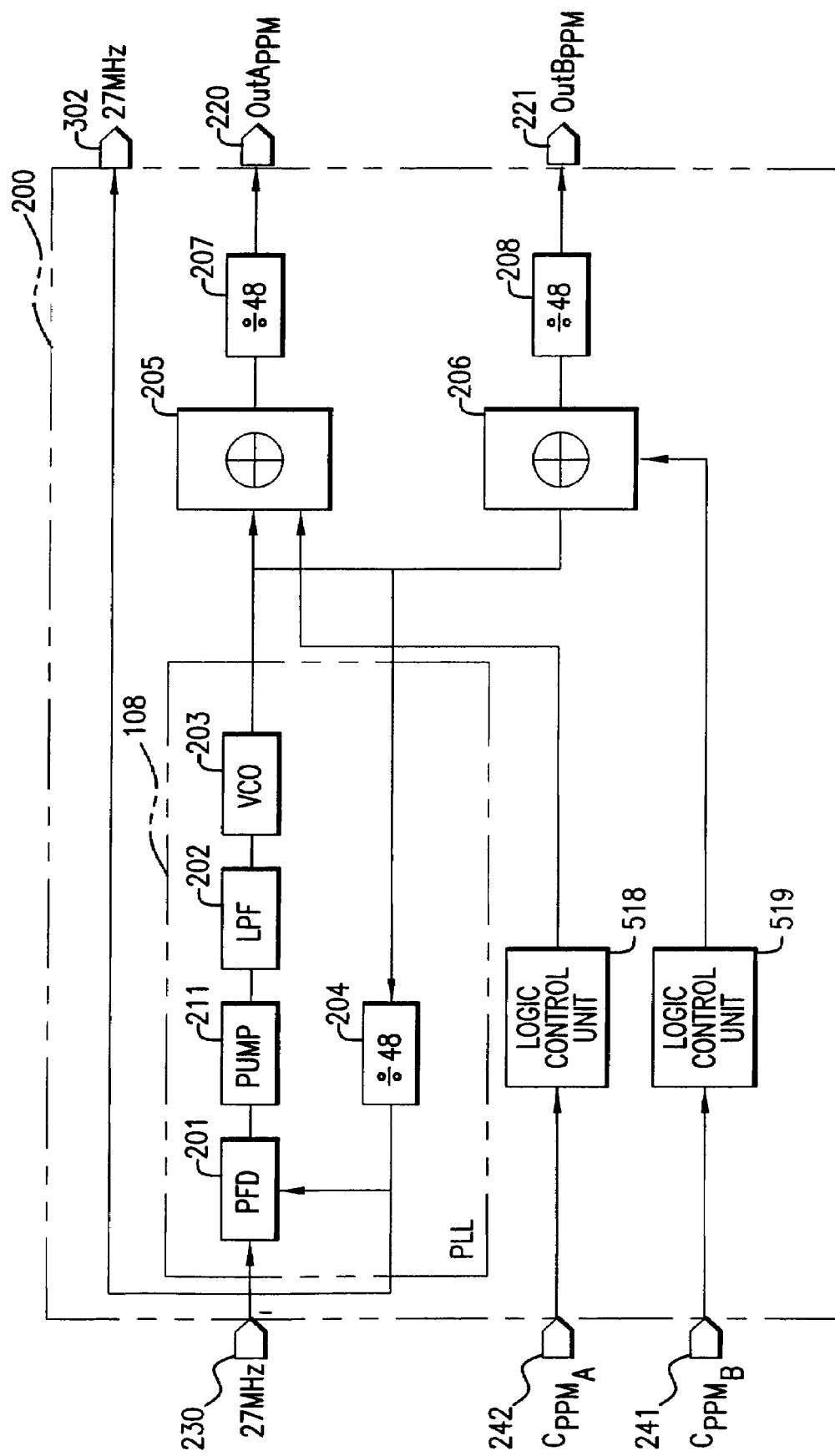
FIG. 5 is a more detailed block diagram of an embodiment of the present invention shown in FIG. 2.

Referring to FIG. 5, the present invention is shown to have a single phase locked loop circuit 108 coupled with two phase rotator circuits 205 and 206. FIG. 5 is a more detailed representation of FIG. 2, discussed above. FIG. 5 shows present invention's system 200. The system 200 comprises the phase locked loop circuit 108 for receiving an input reference signal 231 at the input terminal 230. The PLL 108 is coupled to two phase rotator circuits 205 and 206. The first phase rotator circuit 205 is coupled to a logic control unit 518. The second phase rotator circuit 206 is coupled to a logic control unit 519. Two $C_{PPM}$ signals 241 and 242 are supplied to the second and first phase rotator circuits, respectively. Each logic control unit receives PPM count signals 241 and 242 and activates respective phase rotators to rotate at speeds determined by the control signals 241 and 242. The output signal having an output frequency matching the reference signal frequency is received at output terminal 302 and is determined using formulas (1) and (2) above.

Figure 4:
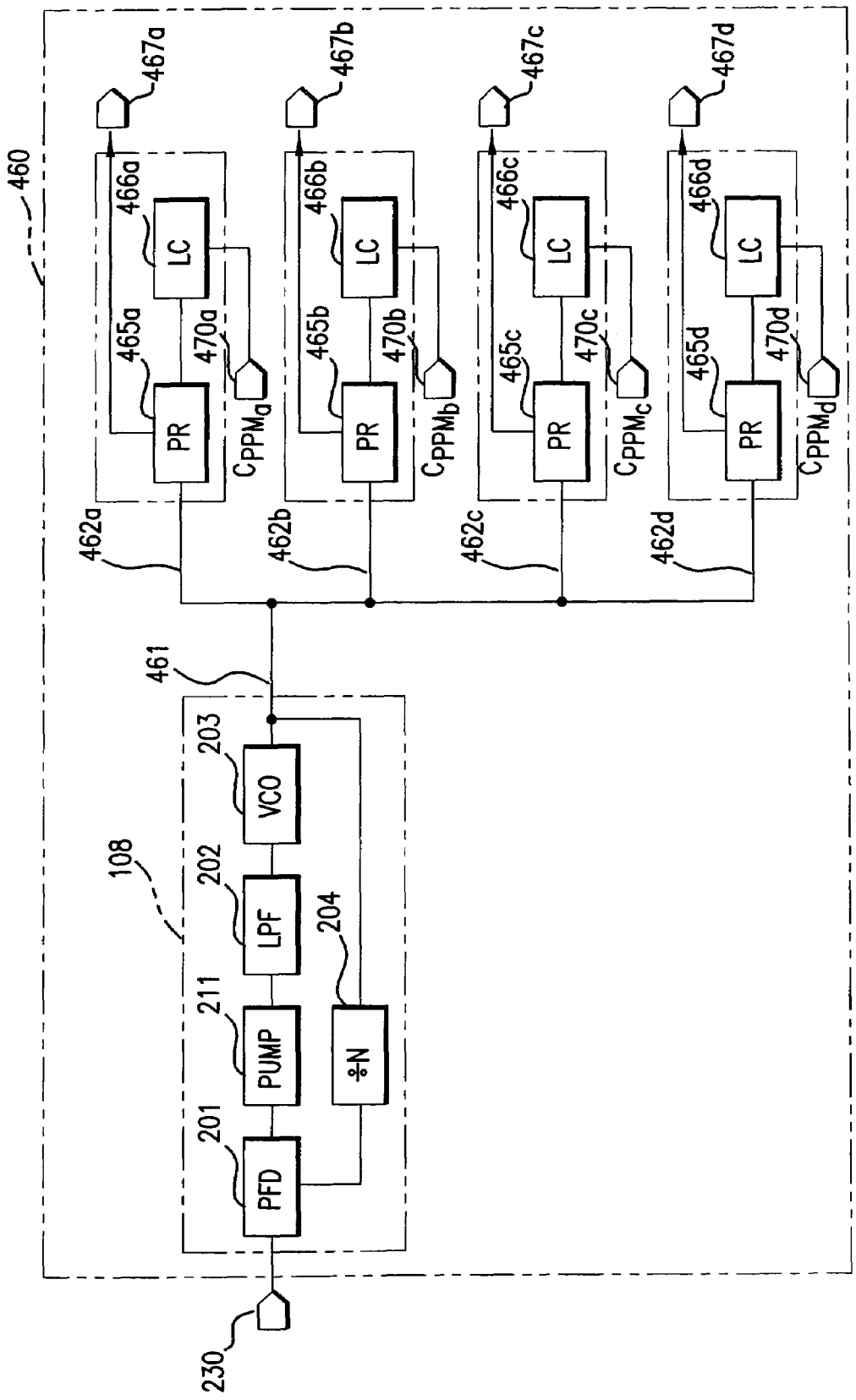
FIG. 4 is an embodiment of the present invention showing a phase locked loop circuit coupled with four phase rotators.

Referring back to FIG. 2, the present invention is shown having PLL 108 coupled to two phase rotator circuits 205 and 206. It is understood by one skilled in the art, that other combinations are possible. For example, referring to FIG. 4, the present invention is shown as system 460. The system 460 has the phase locked loop circuit 108 receiving an input signal at the input terminal 230. The PLL 108 is coupled to four phase rotator circuits 465 (a, b, c, d). The PLL 108 outputs a plurality of output signals having a plurality of phases 461, which are supplied to each of the phase rotator circuits 465 via connectors 462(a, b, c, d), respectively.

Each phase rotator circuit 465(a, b, c, d) further coupled to a logic control unit 466(a, b, c, d), respectively. Each logic control unit 466(a, b, c, d) is controlled by a $C_{PPM(a, b, c, d)}$ signal 470(a, b, c, d), respectively. The $C_{PPM}$ signals activate each respective phase rotator 465(a, b, c, d) to begin generating phases, and control the phase rotation speed, and thereby the frequency shift introduced by each phase rotator.

4. PHASE ROTATOR

As discussed above, the phase rotator (also called a "phase interpolator") generates more phases out of the fixed number of phases that are received from the phase locked loop circuit, and the phases are continuously rotated (in time) to implemented a frequency shift in the output signal. The phases are rotated in an incremental manner, where the difference between two phase states is referred to as jitter, and generally should be reduced.

A rotator consists of a plurality of digital-to-analog converters (DACs) coupled together into a group according to clock phase sources of 0°, 90°, 180°, and 270°. The phase rotator operates in a full phase cycle of 360°.

Referring to FIG. 10, a full phase cycle 1000 of 360° is shown to have a first clock phase source 1001 at 0°, a second clock phase source 1002 at 90°, a third clock phase source 1008 at 180°, and a fourth clock phase source 1009 at 270°. Each clock phase source represents one quarter of the full phase cycle 1000. The clock phase is defined by a relationship where the frequency of a continuously rotated signal is a derivative of the clock phase.

The number of DACs determines the phase jitter in the system. The smaller the number of DACs, the greater the phase jitter or noise, the greater the number of DACs the smaller the jitter. This occurs because the number of DAC also determines the number of phase states that exist in the 360 degree rotation cycle. The greater the number of DACs, the greater the number of phase states. The phase jitter must be significantly reduced without increasing circuit space and power to operate the circuit.

Referring to FIG. 10, phase jitter is represented as a gap that is formed between two adjacent phases generated by the phase rotator. For example, if phase represented by arrows 1004 and 1005 were adjacent phases, the gap 1006 formed between two phases would represent jitter in the system. The larger the gap, the greater the jitter. Conversely, the smaller the gap, the smaller the jitter.

Each DAC group is controlled by a differential signal supplied to the group. The differential signal may come from a phase locked loop circuit coupled with the phase rotator. The PLL may have a plurality of delay cells that may be paired up to generate a plurality of differential signals to be supplied to the phase rotator.

A DAC comprises a switch and a current source. Whenever a current is applied to a DAC and a switch is closed, the digital value of the DAC is 1. When no current is applied to the DAC, the digital value of the DAC is 0. Therefore, any data signals sent to the system will generate current and when this current is applied to the DAC it is represented by a sequence of 0's and 1's in a digital form. Thus, if an n-bit word is received, it is represented by a sequence of 0's and 1's.

Since the decoded digital word is represented by a binary number (0's or 1's), then the entire length of the decoded digital word may be represented by $2^n$, where n is an integer. The integer n is a number of characters in a digital word (i.e., 4-bit, 6-bit, etc.) that are decoded by the rotator's decoder. Therefore, in a 4-bit phase rotator, n equals to 4 and the length of the digital word is 16. In a 6-bit phase rotator, n is 6 and the length of the digital word is 64.

The number of characters that need to be decoded determines how many bits in the decoded digital word would be 1 and how many would be 0. Therefore, in a 4-bit rotator, in the decoded digital word of length 16, there are 4 ones and 12 zeros. Similarly, using the 6-bit rotator, 8 ones and 56 zeros are generated. Each 1 in the decoded digital word corresponds to a DAC being turned on. This means that the switch located in that DAC is closed and the current is supplied to the DAC. Each 0 in the decoded digital word corresponds to a DAC being turned off. This means that the switch located in that DAC is open and no current is supplied to it.

Each decoded digital word represents a particular phase state of the 360 degree phase cycle that is shown in FIG. 10. An output phase is determined by computing the mean of phases defined by adjacent clock phase sources (i.e., 0°, 90°, 180°, or 270°). Therefore, if there are two phases from two adjacent clock phase sources (e.g., 0° and 90°), then the output phase would equal to the mean of the two phases. The following formula represents how the new output phase $\phi_0$ is computed using the two phases $\phi_a$ and $\phi_b$ from two adjacent clock phase sources:

$$\cos(2\pi ft + \varphi_0) \cong \frac{k}{N}\cos(2\pi ft + \varphi_a) + \frac{(N-k)}{N}\cos(2\pi ft + \varphi_b) \quad (4)$$

where k corresponds to the number of DACs that have value 1 in a particular clock phase source (i.e., 0°, 90°, 180°, or 270°), N corresponds to the total number of bits in the DAC (i.e., in a case of 6-bit rotator, there are 8 bits per each clock phase source), f and t correspond to frequency and time, respectively.

In the rotator, the output phase is determined by how many DACs have a value of 1, i.e., a current is supplied to the DAC. For instance, in a 4-bit rotator, if first four DACs (out of 16) have a value of 1, then the output phase is determined by the following $$\frac{4}{4}*(0°) + \frac{0}{4}*(90°) + \frac{0}{4}*(180°) + \frac{0}{4}*(270°) = 0° \quad (5)$$

Therefore, the output phase is 0°. In a second example, the first DAC has a value of 0, and the following four DACs have a value equal to 1. Therefore, the output phase is computed as follows:

$$\text{Output phrase} = \frac{3}{4}*(0°) + \frac{1}{4}*(90°) + \frac{0}{4}*(180°) + \frac{0}{4}*(270°) = 22.5° \quad (6)$$

Therefore, the output phase is 22.5°. The output phase depends on how the current is supplied to each digital-to-analog converter within each clock phase source (0°, 90°, 180°, 270°). Current supply to the DAC corresponds to the value of 1 assigned to the DAC and in the calculation of the output phase counts towards determination of the fraction's numerator of each clock phase source contribution. Referring to the second example above, 3 DACs have a current supplied to them at clock phase source of 0°, and 1 DAC has a current supplied to it at clock phase source of 90°, to produce 22.5° output phase.

Therefore, by decoding information located in the n-bit word supplied to the rotator, the rotator is capable of producing a $2^n$ sequence of 0's and 1's, where there are n ones and ($2^n$−n) zeros. Therefore, since there are $2^n$ combination representing different decoded digital words are possible. Then, the number of phases is $2^n$.

Once the rotator decodes an n-bit digital word into a decoded digital word, the rotator will shift the output phase depending on how the new phases are supplied at each clock phase source. Such shift is performed in a continuous manner. This is accomplished by changing the assigned value of the DACs from 0 to 1 or from 1 to 0. In order to change the value assigned to the DAC, a switch located within each DAC must either be opened or closed. Closed switch means that there is current suppled to the DAC and DAC assumes value of 1 and open switch means that there no current suppled to the DAC and DAC assumes value of 0. By switching DACs on and off, it is possible to achieve a shift in the phase, as indicated in the table in FIG. 11. When there is a shift in the phase, the output phase changes, since the number of 1's and 0's corresponding to a particular DAC changes within each clock phase source.

When input phases shift, depending on whether the rotator is 4-bit or 6-bit or other, there is a gap formed between the output phases. For instance, using the 4-bit rotator, the phase represented by the digital word of 0111100000000000 is 22.5° and the phase represented by the digital word of 0011110000000000 is 45°. Therefore, there is a gap between the above phases of 22.5°. When fine tuning is required, such gap creates jitter in the system, causing distortion in the signal supplied to the output of the system and making it difficult to operate various components coupled to the system. The jitter can be reduced by using a 6-bit rotator, where 8 DACs, at any given time, have value of 1. However, there is still a gap of about 5.625°. This also creates jitter in the system. Furthermore, a 6-bit rotator requires more area and power than a 4-bit rotator.

It is desirable to reduce the jitter and create a greater number of output phases without increasing the phase rotator size or increasing the power requirements needed to operate the phase rotator. In an embodiment, a 6-bit rotator may be used, however, other types of rotators may be used. A 6-bit rotator would generate 64 output phases, out of which a desired phase may be selected. Nonetheless, the gap between two adjacent output phases may be on the order of 5.625°, as described above.

Figure 8A:
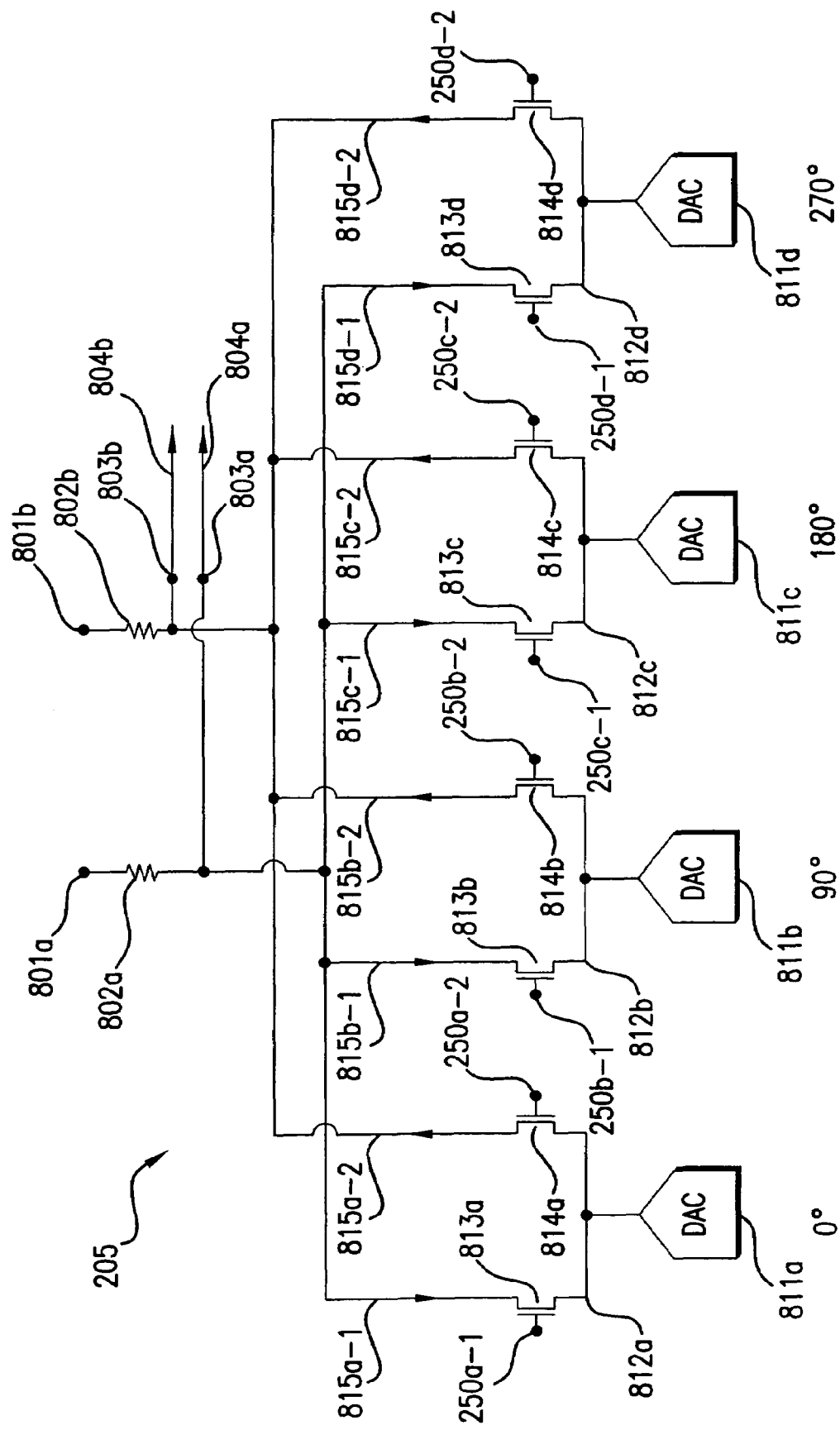
FIG. 8a illustrates a 4-bit phase rotator according to embodiments of the present invention.
Figure 8B:
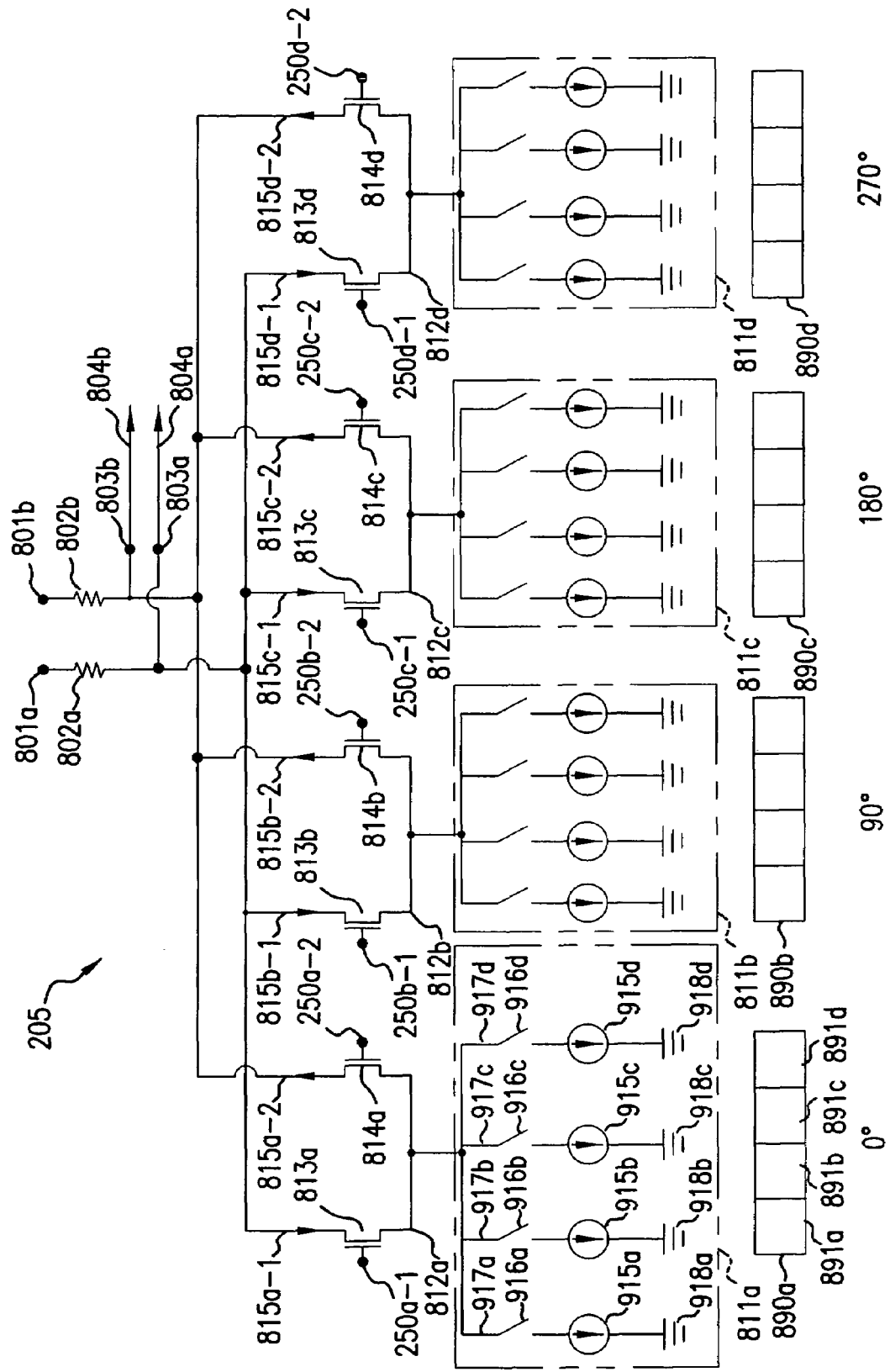

FIGS. 8*a* and 8*b* illustrate 4 DACs placed in groups corresponding to four clock phase sources. FIGS. 8*a* and 8*b* represent an example of a 4-bit rotator, where FIG. 8*b* is a more detailed view of FIG. 8*a*. The 4-bit rotator receives a 4-bit digital word and decodes that word into a sequence of 0's and 1's. This sequence represents a decoded version of the 4-bit word. The 4-bit word is decoded into 16-digit sequence of 0's and 1's. Each 0 and 1 corresponds to a single DAC in the rotator. Thus, in a 4-bit rotator there are 16 digital-to-analog converters, as shown in FIGS. 8(*a, b*) and 9.

Referring to FIGS. 8(*a, b*) and 9, a 4-bit rotator is shown. The current supplied to the rotator is converted to voltage through a load resistor. The voltage output becomes an interpolated phase of clock from two adjacent clock phase sources.

Figure 9:
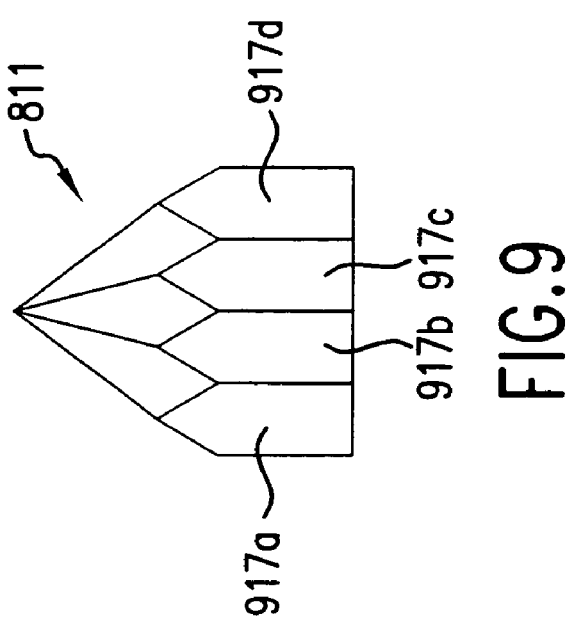

The 4-bit rotator 205 is shown in FIG. 8*a* having four groups of digital-to-analog converters 811 (*a, b, c, d*). The groups 811 correspond to four clock phase sources of 0°, 90°, 180°, 270°, respectively. FIG. 9 is a more detailed view of each DAC group 811. Each DAC group 811 comprises of four digital-to-analog converters 917 (*a, b, c, d*). Each DAC 917 further comprises a switch and a current source. The number of DACs 917 in each group 811 varies with the number of bits in the rotator.

Differential amplifiers 812 are coupled with corresponding DAC groups 811, where the DAC group 811 provides bias current for the corresponding differential amplifier 812. Each differential amplifier 812 comprises a pair of MOS devices 813 (*a, b, c, d*) and 814 (*a, b, c, d*), respectively, so as to provide a differential output 803*a* and 803*b*. The MOS devices 813 (*a, b, c, d*) and 814 (*a, b, c, d*) are controlled by differential signals 250 supplied by the phase locked loop circuit 108 of the present invention. For example, the PLL output signals 250 can be applied to the respective gates of the MOS devices 813 and 814. In an embodiment, the PLL has eight delay cells producing four differential signals, one for each differential amplifier 812. For example, referring to FIG. 8*a*, differential signal 250*a* is applied to the differential amplifier 812*a*, differential signal 250*b* is applied to the differential amplifier 812*b*, and so on. (It is noted that the "−1" and "−2" in the FIG. 8*a* represent the positive and negative components of the differential signal)

The PLL output signals 250 modulate the differential amplifiers 812, in accordance with the current supplied by the active DACs 917 in each respective DAC group 811, to produce weighted output signals 815(*a, b, c, d*). The weighted output signals are weighted relative to each other based on the DAC 917 that are active, as will be described further below. The weighted output signals 815 (*a, b, c, d*) are combined at the output terminals 803 (*a, b*) to produce a differential output signal 804(*a, b*). The differential output signal 804 represents a phase state of the 360 degree cycle, as determined by relative weighting of the weighted output signals 815 (*a, b, c, d*).

As described above, a value of either 0 or 1 is assigned to each of the DACs 917 depending on whether a current is supplied to the DAC 917 or not. If a current is supplied to the DAC 917, then the value that is assigned to that DAC 917 is 1. If the current is not supplied to the DAC 917, then the value of that DAC 917 is 0. Since, there are only two values that can be assigned to each DAC 917 and a 4-bit word is supplied to the rotator, then a sequence of sixteen 0's or 1's is generated representing a 4-bit word, as stated above.

FIG. 8*b* further describes the phase rotator 205. Referring to FIG. 8*b*, each DAC 917 (*a, b, c, d*) is represented by a switch 916 (*a, b, c, d*) and a respective current source 915 (*a, b, c, d*). Each switch 916 is controlled by a corresponding bit in a switch register 890, having individual register outputs 891. The register outputs 891 are grouped together in groups 890*a* through 890*d*, to correspond with the DAC groups 811. Each group 890 (*a, b, c, d*) corresponds to a particular clock phase source of 0°, 90°, 180°, 270°. When a register output 891 is a "1", then the corresponding switch 916 is closed, and current is supplied to the DAC 917. When a register output 891 is a "0", then the corresponding switch 916 is closed, and current is not supplied to the corresponding DAC 917. The result is that the PLL output signals 250 are weighted by the corresponding DACs 917 to produce weighted output signals 815*a-d*. The weighted output signals 815(*a, b, c, d*) represent the clock phase sources (0°, 90°, 180°, 270°), weighted by the corresponding DACs 917. The weighted output signals 815 are combined at the differential output terminals 803, to produce the differential output signal 804, where the output signal 804 represents one of the phase states of the 360 degree cycle illustrated in FIG. 8*b*.

The switch register 890 incrementally shifts a group of "1"s through the output ports 891, where the number of "1"s in a group is $2^n/4$ (n representing number of bits in the phase rotator). As a result, the relative weighting of the weighted output signals 815(*a, b, c, d*) continuously changes over time. The differential output signal 804 can be seen to rotate around the 360 degree cycle that is shown in FIG. 10. This is further described by FIGS. 11 and 12, and the relative discussion given below.

FIG. 11 illustrates sixteen phases of the 4-bit phase rotator that is shown in FIGS. 8*a* and 8*b*. The table by means of which these phases are shown is represented as follows: the rows or "levels" represent particular phase states at a point in time and the columns describe a value (either 0 or 1) assigned to each digital-to-analog converter 917 in the phase rotator by the corresponding shift register output 891. Each level represents a particular phase state around the 360 degree cycle. The next phase is the previous phase shifted. For a 4-bit rotator, there are four DACs 917 assigned to each phase clock source (0°, 90°, 180°, 270°). Thus, first four columns in FIG. 11 represent the first phase clock source (0°), the next four columns represent the second phase clock source (90°) and so on. The output phase is calculated, as is described above, by taking a mean of each of the phase clock sources' corresponding values.

Still referring to FIG. 11, the first phase corresponding to 0° is shown at level 0 and is represented by the following sequence: 1111000000000000. The next phase is represented by 0111100000000000 at level 1. The level 1 phase is the level 0 shifted by one bit. The phase at level 1 corresponds to 22.5°. All of the sixteen phases generated by the 4-bit phase rotator are shown in sequence. The sequence 1111000000000000 can represent a decoded 4-bit digital word that corresponds to a first digital word before the rotator shifts the phase by some degree, as shown in row 0, FIG. 11. When the 4-bit rotator shifts a phase, the next decoded digital word is represented by the following sequence: 0111100000000000 (FIG. 11, row 1).

Figure 7:
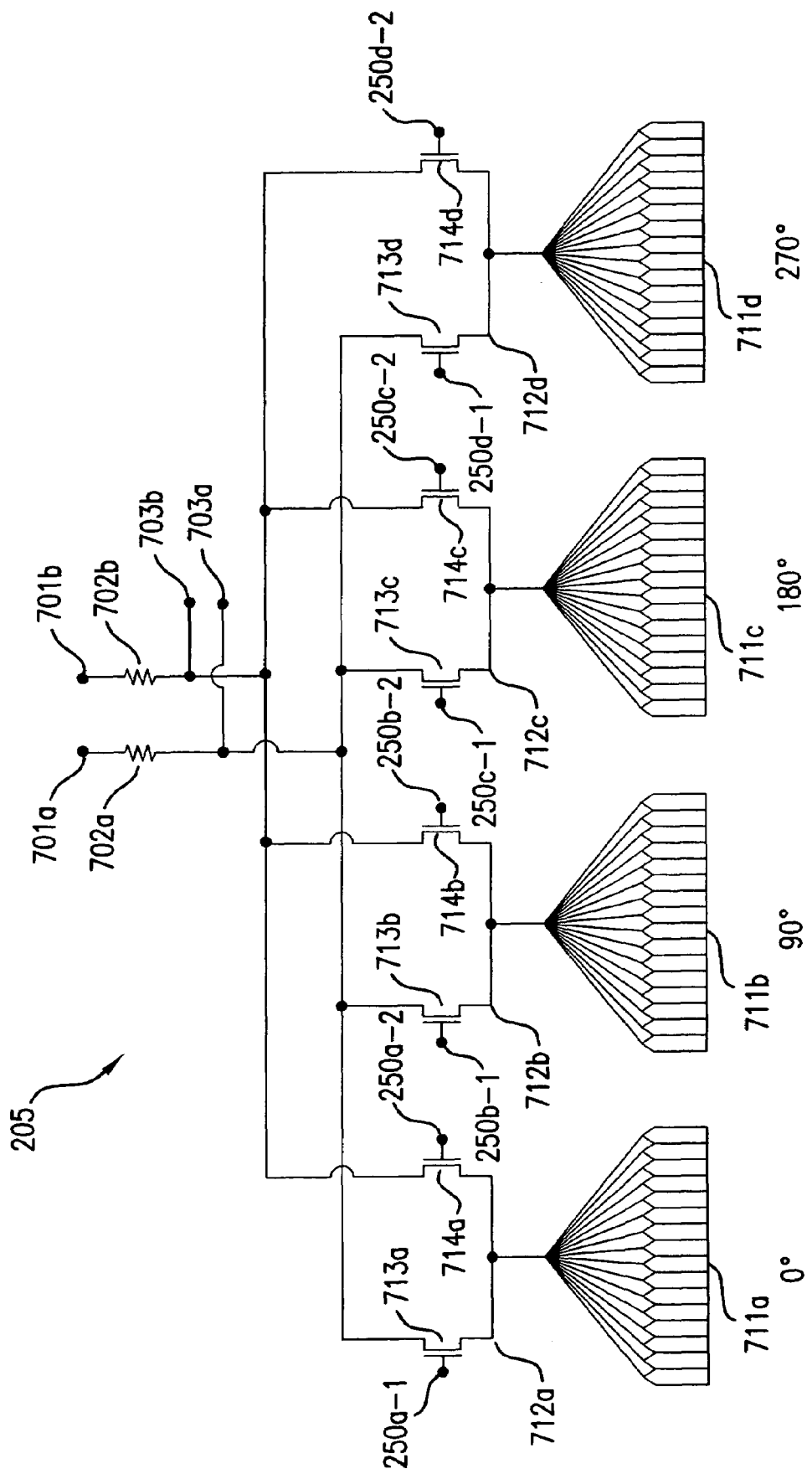
FIG. 7 illustrates is a block diagram of a 6-bit phase rotator according to the present invention.

A 6-bit phase rotator can generate 64 phases, and includes 64 DACs 917 that are grouped accordingly to each adjacent clock phase sources of 0°, 90°, 180°, or 270°. Each group 711 of DACs 917 has sixteen DACs 917 as shown in FIG. 7. A 6-bit digital word is decoded into a sequence of 0's and 1's that is 64 characters long. At any given time, there are eight corresponding DACs that have a value of 1 (meaning the current is supplied to the DAC) and the rest of the DACs have a value of 0 (meaning the current is not supplied to the DAC). The 6-bit phase rotator operates similar to the 4-bit rotator but has more bits and more phase states.

Referring to back to FIG. 10, two adjacent phases generated by the 6-bit phase rotator are shown. A phase 1004 represents a 45° phase generated by a 6-bit rotator. Phase 1005 represents a 33.75° phase, where phase 1005 is an adjacent phase to the phase 1004. A gap 1006 of 11.25° is formed between phases 1004 and 1005. The gap 1006 represents the jitter in the system, when the 6-bit rotator is used to generate and shift phases.

5. LOW JITTER PHASE ROTATOR

In one embodiment, the rotator is implemented to minimize the jitter in the system. More specifically, when the 6-bit rotator shifts from one phase to another (i.e., switching off the first DAC, having the value of 1, and switching on the DAC, having value 0 and following the last DAC having value 1), the current is still suppled to the original first DAC having the value of 1. Therefore, during the next phase, the digital word has nine DACs that have a value of 1. In the next phase shift, only the first DAC is switched off, thereby assuming the value of 0. The phase shift, therefore, proceeds in two stages, thus, generating two separate phases. This procedure is repeated to transition to the other phase states.

In effect, the 6-bit rotator becomes a 7-bit rotator without increasing the circuit size or increasing the power to operate the DAC. The number of output phases generated becomes 128, which is a double of the original 64 output phases that is achieved with a 6-bit rotator. This can narrow the difference between two adjacent phases down to 2.5°, which reduces the jitter in the system. In an embodiment, the above techniques reduces the jitter in the system by 6 dB.

FIG. 12 further illustrates the jitter reduction for a 4-bit phase rotator. Referring to level k, the phase represented by sequence of 0000001111000000 is shown corresponding to 135°. The phase, shown at level k+1, represented by sequence 0000001111100000 corresponds to 144°. The phase, shown at level k+2, represented by 0000000111100000 corresponds to 157.5°. In the conventional 4-bit phase rotator, the phases at level k and k+2 are adjacent phases, and the difference between these two phases would be 22.5°. Whereas, in the present invention, the difference between adjacent phases is narrowed between adjacent phases. Phases at levels k and k+2 are no longer adjacent phases. Phases at levels k and k+1 are adjacent phases and phases at levels k+1 and k+2 are adjacent phases. The phase difference between phases at levels k and k+1 is 9° and the phase difference between phases at levels k+1 and k+2 is 13.5°. Since, the phase difference between the adjacent phases is smaller than in the convention system, the amount of jitter is reduced.

Figure 13:
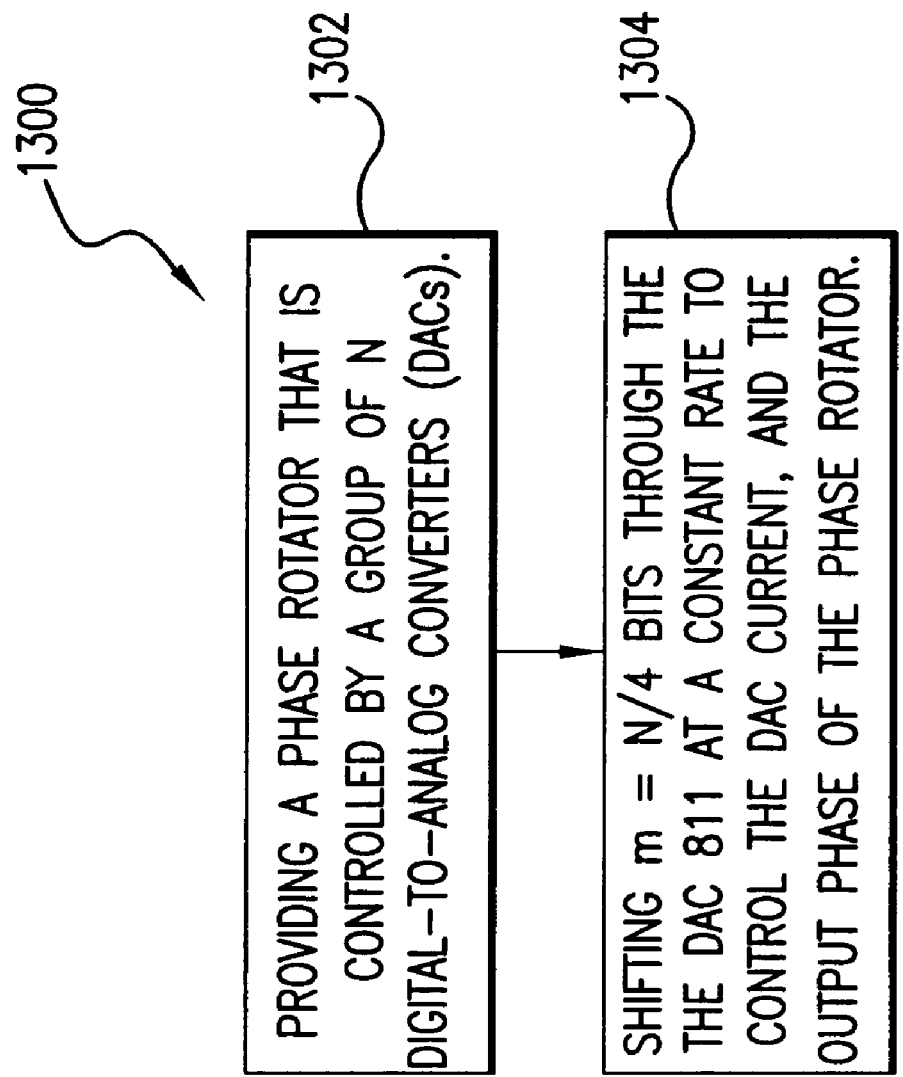
FIG. 13 is a flowchart diagram of the method of operation of the phase rotator in the present invention.
Figure 14:
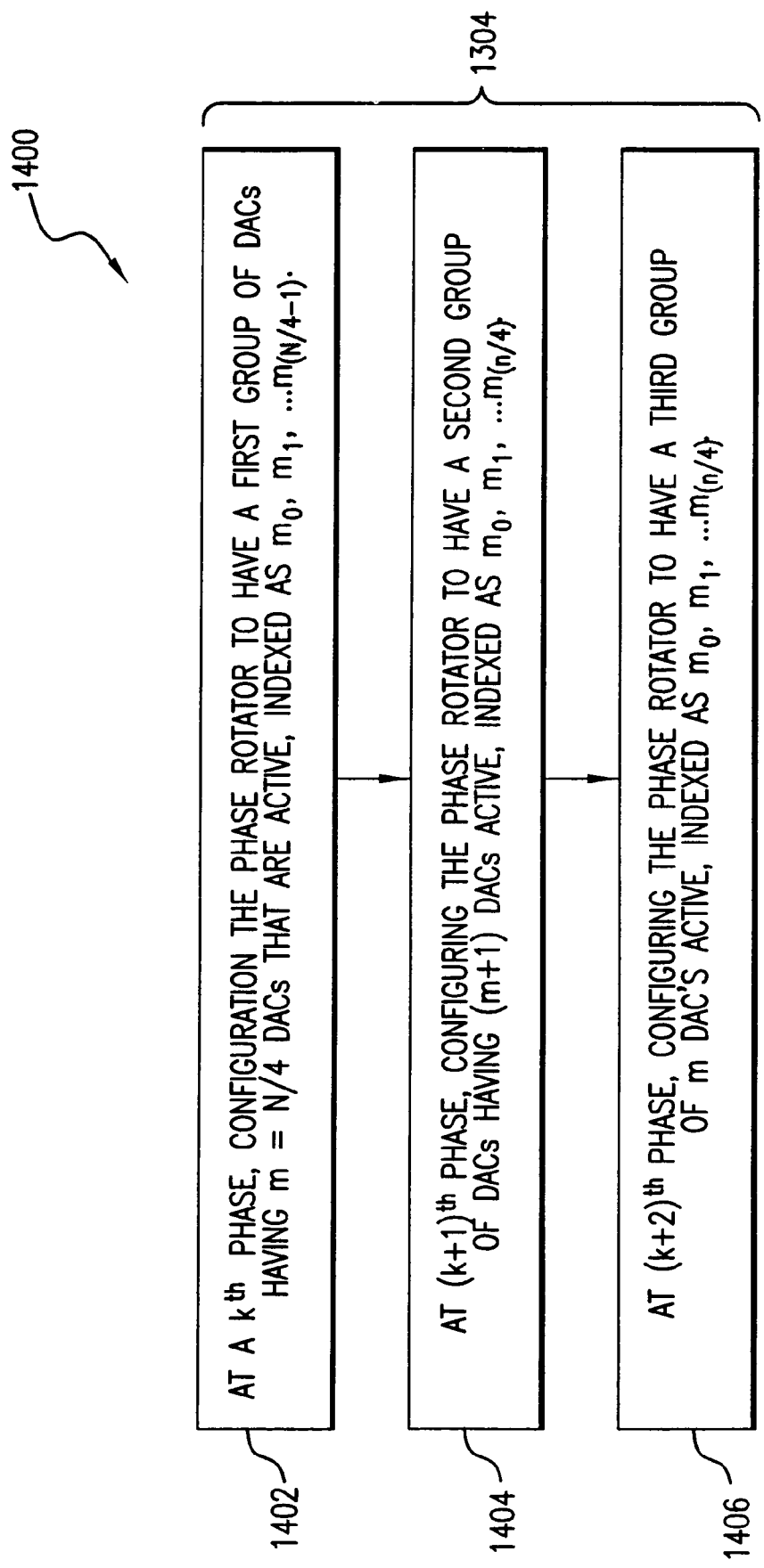
FIG. 14 is a more detailed representation of a FIG. 13 method step of shifting bits in the phase rotator.

The operation of the low jitter phase rotator as described by the 4-bit example in FIG. 12 can be generalized as follows for an n-bit phase rotator made up of a $N=2^n$-number of digital-to-analog converters (DAC). The generalized discussion is further described by flowchart 1300 in FIG. 13.

At step 1302, a phase rotator is provided that is controlled by a group of $N=2^n$ digital-to-analog converters (DACs). For example, the phase rotator 205 in FIGS. 8a and 8b includes a N-bit DAC 811 that controls the phase rotator, where N is 16 in FIGS. 8a and 8b.

At step 1304, m=N/4 bits are shifted through the DAC 811 at a constant rate to control the DAC current, and the output phase of the phase rotator. For example, FIG. 12 illustrates shifting bits through the DAC to control the output phase of the phase rotator.

The step 1304 in the flowchart 1300 can be further described by the flowchart 1400.

At a $k^{th}$ phase in step 1402, the phase rotator is configured to have a first group of DACs having m=N/4 DACs that are active, indexed as $m_0, m_1, \ldots m_{(N/4-1)}$. For example, referring to FIG. 12 at level k, the DACs #7-10 are active, where DAC #7 represents $m_0$, and DAC #8 represents $m_1$, DAC #9 represents $m_2$, and DAC #10 represents $m_3$.

At $(k+1)^{th}$ phase at step 1404, the phase rotator is configured to have a second group of DACs having (m+1) DACs active, indexed as $m_0, m_1 \ldots m_{(N/4)}$. For example, referring to FIG. 12, the DACs 7-11 are active, where DAC #11 represents $m_4$.

At $(k+2)^{th}$ phase at step 1406, the phase rotator is configured to have a third group of m DACs active, indexed as $m_1, m_2, \ldots m_{(N/4)}$. For example, referring to FIG. 12, the DACs 8-11 are active.

The steps in flowchart 1400 are continuously repeated for all the phase states around the 360 degree phase cycle. It is noted that the $m_0^{th}$ DAC is left active at the $(k+1)^{th}$ phase, and is not deactivated until the $(k+2)^{th}$. The result is that there is one more active DAC at the $(k+1)^{th}$ phase than at the $k^{th}$ phase or the $(k+2)^{th}$ phase. Therefore, the gaps between the $k^{th}$, $(k+1)^{th}$, and $(k+2)^{th}$ phase states are reduced, thereby reducing the phase jitter of the phase rotator.

It is understood by one skilled in the art that the low jitter phase rotator is not limited to having four clock phase sources. In another embodiment, the phase rotator may be provided that is controlled by a group of N digital-to-analog converters (DACs), where N is a positive integer. For example, the phase rotator 205 in FIGS. 8a and 8b includes N-bit DAC 811 that control the phase rotator, where M<N. At any given time, m=M bits are shifted through the DAC 811 at a constant rate to control the DAC current, and the output phase of the phase rotator.

At a $k^{th}$ phase, the phase rotator is configured to have a first group of DACs having m=M DACs that are active, indexed as $m_0, m_1, \ldots m_{(M-1)}$.

At $(k+1)^{th}$ phase, the phase rotator is configured to have a second group of DACs having m=M+1 DACs active, indexed as $m_0, m_1, \ldots m_{(M)}$.

At $(k+2)^{th}$ phase, the phase rotator is configured to have a third group of m DACs active, indexed as $m_1, m_2, \ldots m_{(M)}$.

The above steps are continuously repeated for all the phase states around the 360 degree phase cycle. It is noted that the $m_0^{th}$ DAC is left active at the $(k+1)^{th}$ phase, and is not deactivated until the $(k+2)^{th}$. The result is that there is one more active DAC at the $(k+1)^{th}$ phase than at the $k^{th}$ phase or the $(k+2)^{th}$ phase. Therefore, the gaps between the $k^{th}$, $(k+1)^{th}$, and $(k+2)^{th}$ phase states are reduced, thereby reducing the phase jitter of the phase rotator.

6. CONCLUSION

Example embodiments of the methods, circuits, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An apparatus, comprising:
a shift register having a plurality of outputs configured to control a plurality of digital to analog converters (DACs), wherein each output in said plurality of outputs is configured to control a respective DAC in said plurality of DACs,
wherein said shift register is configured to cycle a group of adjacent bits through said plurality of outputs,
wherein said shift register sets a leading bit of said group of adjacent bits prior to changing a state of a trailing bit of said successive plurality of bits,
wherein a first delay between setting said leading bit and changing said state of said trailing bit defines a first collective state of said plurality of DACs, and
wherein a second delay between changing said state of said trailing bit and setting a subsequent leading bit of said group of adjacent bits defines a second collective state of said plurality of DACs.

2. The apparatus of claim 1, further comprising:
a plurality of differential amplifiers configured to receive a plurality of input differential signals having different phases and generate a plurality of weighted signals responsive to said plurality of input differential signals;
wherein said plurality of DACs are arranged into a plurality of groups, each group configured to supply current for one of said differential amplifiers, wherein a number of active DACs in each group determines a relative weighting of said weighted signals, said relative weighting determining an output phase of an output signal of a phase rotator; and
an output terminal configured to combine said plurality of weighted signals.

3. The apparatus of claim 2, wherein said group of adjacent bits are continuously shifted through said shift register, thereby causing said output phase to rotate around a 360 degree cycle.

4. The apparatus of claim 2, wherein said output signal is frequency-shifted based on a rate that said adjacent plurality of bits are shifted through said shift register.

5. The apparatus of claim 2, wherein a logic control circuit determines a rate that said adjacent plurality of bits are shifted through said shift register, said rate determining a rotation speed of said output phase.

6. The apparatus of claim 5, wherein said rate determines a frequency shift of said output signal.

7. The apparatus of claim 2, wherein said different phases of said input differential signals represent a plurality of clock sources each differing in phase by 90°, said plurality of clock sources weighted by said plurality of DACs.

8. The apparatus of claim 2, wherein each differential amplifier includes a first field effect transistor (FET) and a second FET having their respective sources coupled to a common current output of one of said plurality of DACs, a respective gate of said first and second FETs receiving a respective input differential signal, a respective drain of said first and second FETs coupled to said output terminal.

9. The apparatus of claim 1, wherein each DAC further comprises a switched current supply, wherein said output is configured to activate and deactivate said switched current supply.

10. The apparatus of claim 9, wherein said switched current supply includes a current source that is series-coupled with a switch.

11. A method of shifting an output phase of a phase rotator between adjacent phase states, the phase rotator having a shift register coupled to a plurality of digital-to-analog converters (DACs) that determine said output phase of the phase rotator, comprising:
cycling a group of adjacent bits through the shift register, including:
(a) setting a subsequent leading bit of said group of adjacent bits,
(b) executing a first delay,
(c) changing a state of a trailing bit of said group of adjacent bits,
(d) executing a second delay equal in duration to said first delay, and
(e) repeating steps (a) through (d); and
activating, based on a state of the shift register, particular ones of the plurality of DACs that determine said output phase of the phase rotator.

12. A phase rotator, comprising:
means for cycling a group of adjacent bits through a shift register, including:
(a) setting a bit in said shift register as a subsequent leading bit of said group of adjacent bits,
(b) executing a first delay,
(c) changing a state of a trailing bit of said group of adjacent bits,
(d) executing a second delay equal to said first delay, and
(e) repeating steps (a) through (d); and
means for activating, based on a state of said shift register, particular ones of a plurality of digital to analog converters (DACs) that determine an output phase of the phase rotator.

\* \* \* \* \*